United States Patent
Yasui et al.

(10) Patent No.: US 10,253,395 B2
(45) Date of Patent: Apr. 9, 2019

(54) ELECTRONIC CIRCUIT MODULE COMPONENT

(71) Applicant: TDK CORPORATION, Minato-ku (JP)

(72) Inventors: Tsutomu Yasui, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 541 days.

(21) Appl. No.: 14/923,831

(22) Filed: Oct. 27, 2015

(65) Prior Publication Data

US 2016/0128196 A1    May 5, 2016

(51) Int. Cl.
| | |
|---|---|
| C22C 19/03 | (2006.01) |
| B23K 35/26 | (2006.01) |
| B23K 35/30 | (2006.01) |
| C22C 13/02 | (2006.01) |
| C22C 1/04 | (2006.01) |
| H05K 3/34 | (2006.01) |

(52) U.S. Cl.
CPC ............ *C22C 19/03* (2013.01); *B23K 35/262* (2013.01); *B23K 35/3033* (2013.01); *C22C 1/0433* (2013.01); *C22C 1/0483* (2013.01); *C22C 13/02* (2013.01); *H05K 3/3463* (2013.01)

(58) Field of Classification Search
None
See application file for complete search history.

(56) References Cited

U.S. PATENT DOCUMENTS

2011/0182041 A1 *   7/2011   Yasui ................ B23K 35/0244
                                                          361/747
2016/0008930 A1    1/2016   Yasui et al.

FOREIGN PATENT DOCUMENTS

| JP | 2007-268569 A | 10/2007 |
|---|---|---|
| JP | 2011-152581 A | 8/2011 |
| JP | 2012-076098 A | 4/2012 |
| JP | 2013-157356 A | 8/2013 |
| JP | 2013154354  *  | 8/2013 |

* cited by examiner

Primary Examiner — Daniel J. Schleis
(74) Attorney, Agent, or Firm — Oliff PLC (57) ABSTRACT

An electronic circuit module component includes: an electronic component; a circuit board including the electronic component mounted thereon; and a bonding metal disposed between a terminal electrode of the electronic component and a terminal electrode of the circuit board, and including Sn alloy phases, an Ni—Sn alloy phase that disperses and forms between the Sn alloy phases and includes at least Fe, and a plurality of holes that is formed inside the Ni—Sn alloy phase and has a diameter of 5 μm or less. A center distance between the holes adjacent to each other is 10 μm or more.

7 Claims, 7 Drawing Sheets

ELECTRONIC CIRCUIT MODULE COMPONENT

TECHNICAL FIELD

The present invention relates to an electronic circuit module component.

BACKGROUND

An electronic circuit module component manufactured by mounting an electronic component, such as a passive element, on a substrate is mounted on a substrate of an electronic device so as to be used. As solder used for bonding the electronic component in the electronic circuit module component and mounting the electronic circuit module component, a Pb-free solder including no Pb (lead) has been known.

When the electronic circuit module component is mounted on the substrate of the electronic device, reflow for melting the solder is performed. Various examinations have been conducted in order to prevent the solder for bonding the electronic component and the substrate in the electronic circuit module component from scattering or moving upon the reflow (for example, refer to JP 2007-268569 A).

SUMMARY

However, even when bonding is performed using the solder described in JP 2007-268569 A, there is a still problem that the scatter or the movement of the solder cannot be completely inhibited. In addition, further improvement is required in terms of durability.

The present invention has been made in consideration of the above problem. An object of the present invention is to provide an electronic circuit module component in which damage of a bonding metal upon reheating in a manufacturing process is prevented.

In order to achieve the above object, the electronic circuit module component according to the present invention includes: an electronic component; a circuit board including the electronic component mounted thereon; and a bonding metal disposed between a terminal electrode of the electronic component and a terminal electrode of the circuit board, and including Sn alloy phases, an Ni—Sn alloy phase that disperses and forms between the Sn alloy phases and includes at least Fe, and a plurality of holes that is formed inside the Ni—Sn alloy phase and has a diameter of 5 µm or less. A center distance between the holes adjacent to each other is 10 µm or more.

According to the above electronic circuit module component, the bonding metal including the Ni—Sn alloy phase that has a melting point higher than that of the Sn alloy phase, is formed. Therefore, even when the reheating is performed, remelting of the bonding metal is prevented. Since the Ni—Sn alloy phase harder than a Sn phase disperses so as to form between the Sn alloy phases, even when, for example, a crack occurs inside the bonding metal, progress of the crack is inhibited. Therefore, the damage of the bonding metal is prevented. Furthermore, the hole having a diameter of 5 µm or less is formed inside the Ni—Sn alloy phase. Therefore, even when a crack occurs inside the Ni—Sn alloy phase, progress of the crack is inhibited. As a result, durability can be improved.

Here, the bonding metal may further include a Bi alloy phase. Since the bonding metal further includes the Bi alloy phase harder than the Ni—Sn alloy phase, the durability against, for example, the crack can be further improved.

The Bi alloy phase may have an equivalent diameter of 3 µm or less. Since the Bi alloy phase has the equivalent diameter of 3 µm or less, degradation of durability of the entire bonding metal by segregation of the Bi alloy phase can be prevented.

The Ni—Fe alloy phase may be included in a region separating from the hole with a center distance of 10 µm or more. As described above, when the Ni—Fe alloy phase is included, a large number of regions individually having hardness different from each other are formed. Therefore, the entire bonding metal can be inhibited from the progress of the crack. As a result, the durability can be improved.

According to the present invention, there is provided an electronic circuit module component in which the damage of the bonding metal upon the reheating in the manufacturing process is prevented.

DETAILED DESCRIPTION

An embodiment of the present invention will be described in detail below with reference to the attached drawings. Note that, in descriptions of the drawings, substantially the same elements are denoted with the same reference signs, and the duplicate descriptions thereof will be omitted.

Figure 1:
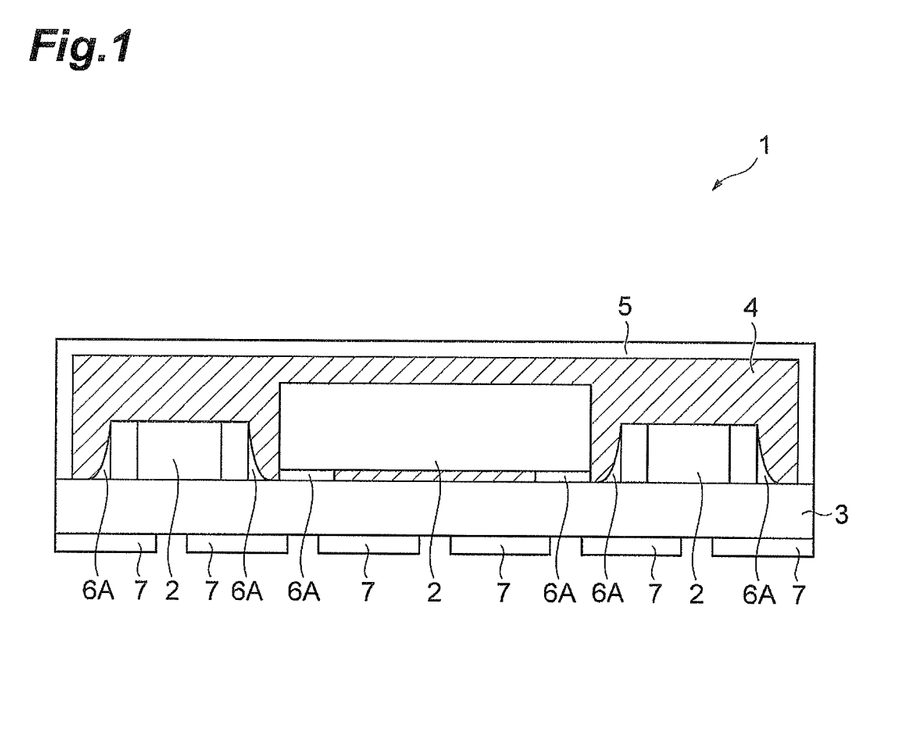
FIG. 1 is a cross-sectional view of an electronic circuit module component.
Figure 2:
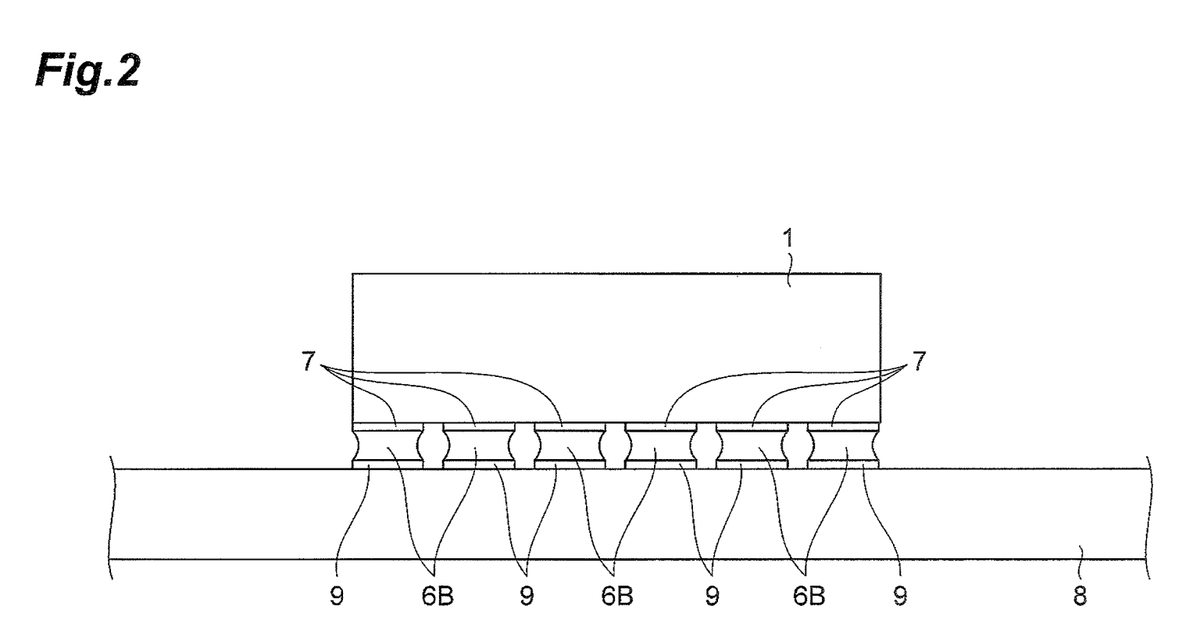
FIG. 2 is a side view of the electronic circuit module component mounted on a substrate of, for example, an electronic device.

FIG. 1 is a cross-sectional view of an electronic circuit module component. FIG. 2 is a side view of the electronic circuit module component mounted on a substrate of, for example, an electronic device. As illustrated in FIG. 1, an electronic circuit module component 1 is a module that includes a plurality of electronic components 2 mounted on a substrate 3 and has a set of functions. The electronic component 2 may be mounted on a surface of the substrate 3 or inside the substrate 3. According to the present embodiment, as the electronic component 2 included in the electronic circuit module component 1, a passive element, such as a coil, a capacitor, or a resistance are used. As the electronic component 2, an active element, such as a diode or a transistor, or an integral circuit (IC) may be also mounted on the surface of the substrate 3 or inside the substrates 3. The electronic component 2 is not limited to these components.

As illustrated in FIG. 1, the electronic circuit module component 1 includes the substrate 3 as a circuit board on which the electronic component 2 is mounted, an insulating resin 4 for covering the electronic component 2, and a shielding layer 5 for covering a surface of the insulating resin 4. Note that the electronic circuit module component 1 may not include the shielding layer 5. A terminal electrode of the electronic component 2 and a terminal electrode of the substrate 3 are bonded with a Pb-free solder 6A (hereinafter, referred to as first solder) according to the present embodiment. Accordingly, the electronic component 2 is mounted on the substrate 3. As described above, the first solder 6A serves as a bonding metal disposed between the terminal electrode of the electronic component 2 and the terminal electrode of the substrate 3.

As illustrated in FIG. 1, in the electronic circuit module component 1, the insulating resin 4 covers the electronic component 2 mounted on the substrate 3. In the electronic circuit module component 1, the insulating resin 4 also covers the surface of the substrate 3 on the side on which the electronic component 2 is mounted (also referred to as a component mounting surface). As described above, in the electronic circuit module component 1, the insulating resin 4 covers the plurality of electronic components 2 and the component mounting surface so that the substrate 3 and the plurality of electronic components 2 are integrally formed and strength is also secured.

The shielding layer 5 is formed on the surface of the insulating resin 4 that covers the plurality of electronic components 2. For example, an epoxy resin as a thermosetting resin can be used as the insulating resin 4. However, the insulating resin 4 is not limited to this resin. Note that the insulating resin 4 may include an additive, such as a filler.

According to the present embodiment, the shield layer 5 is constituted of a conductive material (a material having conductivity, and a metal is used according to the present embodiment). According to the present embodiment, the shield layer 5 may be constituted of a single conductive material or layers of a plurality of conductive materials. The shield layer 5 covers the surface of the insulating resin 4 so as to shield the electronic component 2 enclosed inside the insulating resin 4 from, for example, a high frequency noise or an electromagnetic wave from the outside of the electronic circuit module component 1, or shield, for example, a high frequency noise emitted from the electronic component 2. As described above, the shield layer 5 serves as an electromagnetic shield. According to the present embodiment, the shield layer 5 covers the entire surface of the insulating resin 4. Note that the shield layer 5 may cover the insulating resin 4 so as to fulfill a function required as the electromagnetic shield. The shield layer 5 does not necessarily need to cover the entire surface of the insulating resin 4. Therefore, the shield layer 5 may cover at least a part of the surface of the insulating resin 4.

Note that the electronic circuit module component 1 may not include the shield layer 5. In this case, the insulating resin 4 also covers a region corresponding to the shield layer 5 of the electronic circuit module component 1.

The electronic circuit module component 1 is manufactured by the following procedure.

(1) Print a solder paste including the first solder 6A on the terminal electrode of the substrate 3.

(2) Use a mounter so that the electronic component 2 is mounted on the substrate 3.

(3) Put the substrate 3 including the electronic component 2 mounted thereon into a reflow furnace and heat the solder paste. Melt and harden the first solder 6A included in the solder paste so that the terminal electrode of the electronic component 2 and the terminal electrode of the substrate 3 are bonded (a reflow process).

(4) Clean flux adhering to the electronic component 2 and the surface of the substrate 3.

(5) Cover the electronic component 2 and the substrate 3 with the insulating resin 4 (a mold process).

In the reflow process in the above procedure, the maximal temperature of the reflow furnace is typically set so as to be approximately 240° C. to 260° C. Then, the melting and the hardening of the first solder 6A included in the solder paste are performed. The mold process is appropriately changed depending on, for example, a material of the insulating resin 4. For example, hardening of the insulating resin 4 is performed by heating at 175° C. for four hours.

The substrate 3 includes a terminal electrode (a module terminal electrode) 7 on the opposite side of the component mounting surface. The module terminal electrode 7 is electrically coupled to the electronic component 2 included in the electronic circuit module component 1. As illustrated in FIG. 2, the module terminal electrode 7 is also bonded to a terminal electrode (a device board terminal electrode) 9 of a substrate 8 on which the electronic circuit module component 1 is mounted (for example, a substrate of an electronic device, hereinafter, referred to as a device board) with solder (hereinafter, referred to as second solder) 6B. Accordingly, the electronic circuit module component 1 exchanges an electrical signal and power between the electronic component 2 and the device board 8.

The device board 8 illustrated in FIG. 2 is a substrate on which the electronic circuit module component 1 is mounted. For example, the device board 8 is equipped in an electronic device (for example, an in-vehicle electronic device or a mobile electronic device). When the electronic circuit module component 1 is mounted on the device board 8, for example, a solder paste including the second solder 6B is printed on the device board terminal electrode 9 and then a mounter is used so that the electronic circuit module component 1 is mounted on the device board 8. The device board 8 including the electronic circuit module component 1 mounted thereon is put into the reflow furnace and the solder paste is heated so that the second solder 6B included in the solder paste melts and hardens. As a result, the module terminal electrode 7 and the device board terminal electrode 9 are bonded. After that, flux adhering to the electronic circuit module component 1 and a surface of the device board 8 is cleaned.

A melting temperature of a Pb-free solder used for manufacturing an electronic circuit module component is typically approximately 220° C. In contrast, the maximal temperature upon the reflow is approximately 240 to 260° C. As described above, since the reflow is performed when the electronic circuit module component 1 is mounted on the device board 8, solder that does not melt at the temperature upon the reflow (high temperature solder) is used for the first solder 6A used for mounting the electronic component 2 included in the electronic circuit module component 1, on the substrate 3.

Solder including Pb includes solder with a melting temperature of approximately 300° C. However, no Pb-free solder has a melting temperature of 260° C. or more, and an appropriate property. Accordingly, when the Pb-free solder is used, two types of solder that have a small difference between melting temperatures of the two types of solder may be used for the solder used for bonding the electronic component 2 included in the electronic circuit module component 1 (first solder 6A) and the solder used for mounting the electronic circuit module component 1 on the device board 8 (second solder 6B).

When the solder used for bonding the electronic component 2 included in the electronic circuit module component 1 remelts upon the reflow, a defect, such as a movement of the first solder 6A or solder flash (scatter of solder) occurs. As a result, a short-circuit or contact failure of the electronic component 2 may occur. Accordingly, solder that does not remelt upon the reflow when the electronic circuit module component 1 is mounted, or solder with the remelting that does not cause the movement of the first solder 6A or the solder flash, is preferably used for the solder for bonding the electronic component 2 of the electronic circuit module component 1. An alternative of solder with a high melting temperature includes a conductive adhesive (for example, an Ag paste). However, the conductive adhesive has problems, such as low mechanical strength, high electric resistance, and a high cost. Therefore, the conductive adhesive is not used as the alternative of the solder. The first solder 6A used for bonding the electronic component 2 included in the electronic circuit module component 1 according to the present embodiment is a Pb-free solder that satisfies the above requirements.

Figure 3:
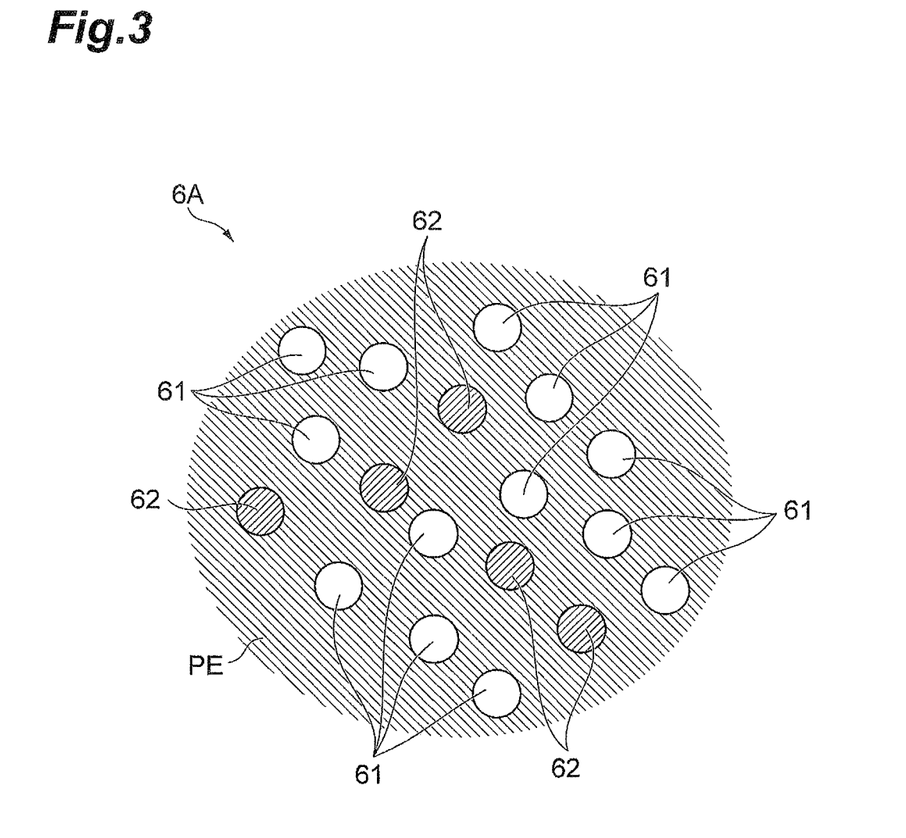
FIG. 3 is a conceptual diagram of a Pb-free solder according to the present embodiment.
Figure 4:
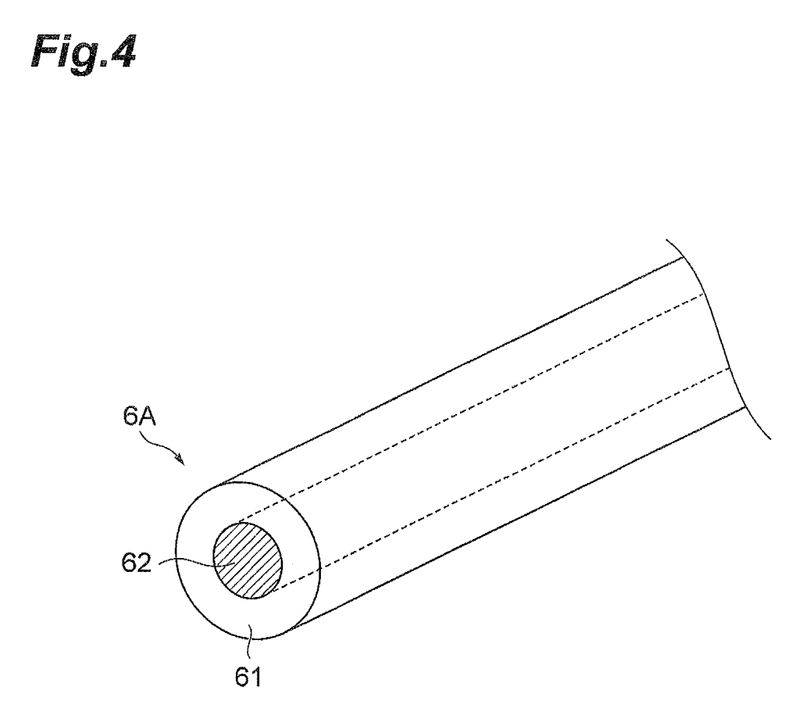
FIG. 4 is a conceptual diagram of the Pb-free solder according to the present embodiment.

FIGS. 3 and 4 are conceptual diagrams of the Pb-free solder according to the present embodiment. The Pb-free solder according to the present embodiment, namely, the first solder 6A includes a first metal 61 including at least tin (Sn) and bismuth (Bi), and a second metal 62 including as least a nickel (Ni)-iron (Fe) alloy before use (before melting). The first solder 6A illustrated in FIG. 3 is a solder paste made by dispersing the granular first metal 61 and the granular second metal 62 into a paste material PE. The first solder 6A illustrated in FIG. 4 is wiry solder including the second metal 62 as a core covered with the first metal 61. As described above, before the melting, the first solder 6A may be in a state where the first metal 61 including at least Sn and Bi, and the second metal 62 including at least the Ni—Fe alloy are mixable upon the melting.

The first metal 61 includes at least Sn and Bi. However, since the first solder 6A is the Pb-free solder, the first solder includes no Pb. The first metal 61 may include at least one of silver (Ag) and copper (Cu). The second metal 62 includes at least the Ni—Fe alloy. That is, the second metal 62 may include at least one of cobalt (Co), molybdenum (Mo), copper (Cu), and chrome (Cr) other than the Ni—Fe alloy.

According to the present embodiment, the so-called SnBi solder (a Pb-free solder) is used as the first metal 61. In the first metal 61, the sum of Sn and Bi is 90 mass % or more, and Bi is 5 to 15 mass %. Since this type of solder includes an Sn phase accounting for most of tissue after the reflow, when the reflow is performed several times, the Sn phase remelts. Accordingly, according to the present embodiment, as a metal that compounds with Sn so as to easily produce a compound upon the reflow, the second metal 62 including at least the Ni—Fe alloy is added to the first metal 61. That is, the Ni—Fe alloy is added to the first metal 61 including Sn and Bi. Accordingly, when the first solder 6A first melts, Sn included in the first metal 61 and Ni—Fe included in the second metal 62 react with each other so that the tissue having high thermal resistance is produced when the first solder 6A hardens. For example, even when the first solder 6A is heated by the second reflow, remelting of the first solder 6A is inhibited.

Figure 5:
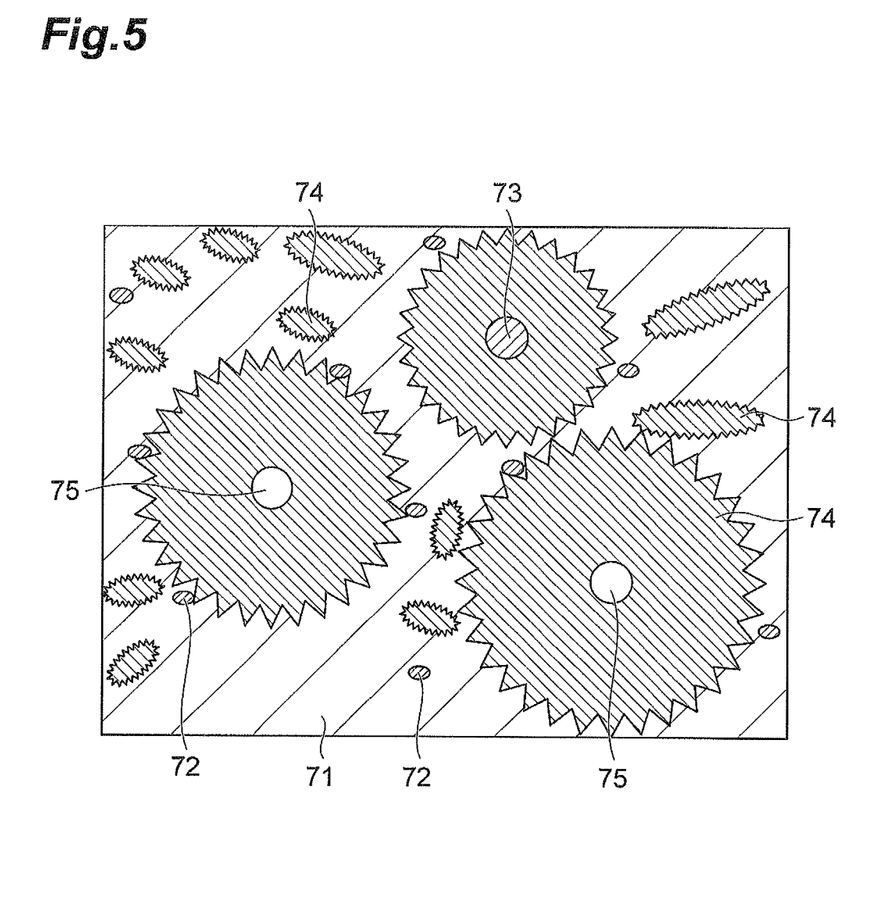
FIG. 5 is a schematic view of tissue of first solder after hardening.
Figure 6:
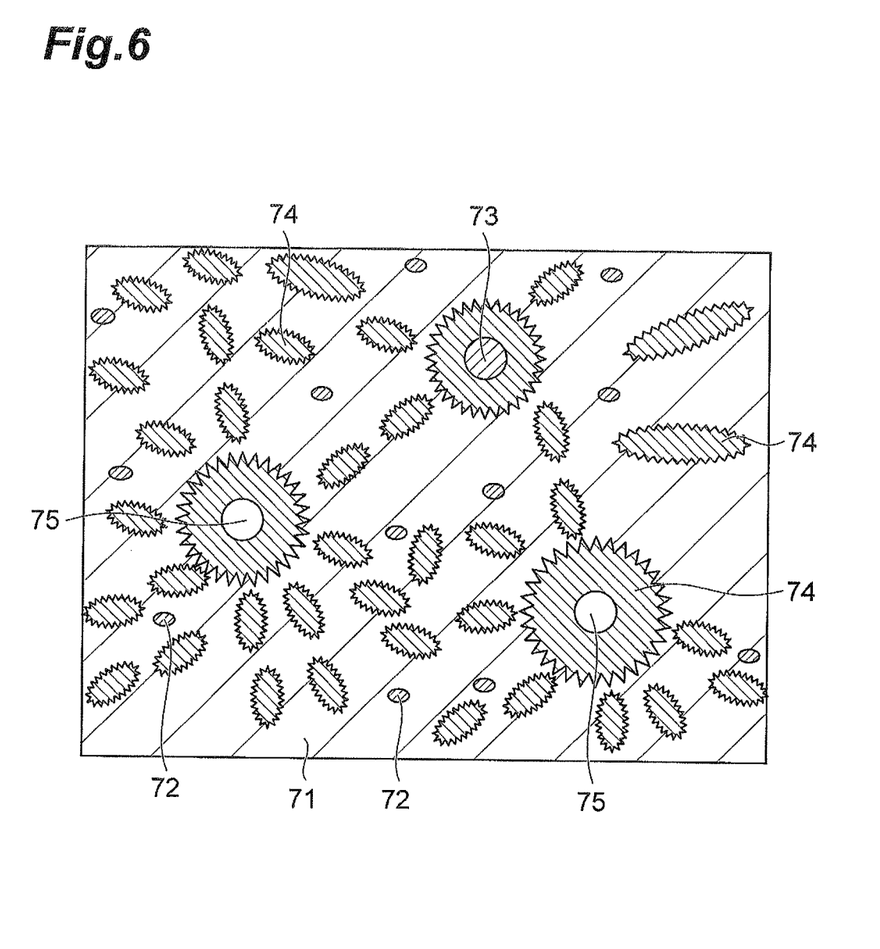
FIG. 6 is a schematic view of the tissue of the first solder after hardening.

FIGS. 5 and 6 are schematic views of the bonding metal formed of the first solder 6A that has hardened. In FIG. 5, an additive amount of Bi is 7.5 mass % in the first metal 61 before the hardening. In FIG. 6, the additive amount of Bi is 12.5 mass % in the first metal 61 before the hardening. As illustrated in FIGS. 5 and 6, with the bonding metal formed of the first solder 6A that has hardened, a Bi phase 72 (a Bi alloy phase) disperses and precipitates in the Sn phase 71 (a Sn alloy phase) deriving from the first metal 61. An Ni—Sn phase 74 (an Ni—Sn alloy phase) caused by a reaction between Sn deriving from the first metal 61 and Ni deriving from the second metal 62 is formed around an Ni—Fe phase 73 (an Ni—Fe alloy phase) deriving from the second metal 62. The Ni—Sn phase 74 also includes Fe deriving from Ni—Fe included in the second metal 62. That is, the Ni—Sn phase 74 includes at least Fe.

In a region where the reaction between Ni and Sn has progressed, a part where the Ni—Fe phase 73 is on the inside of the Ni—Sn phase 74 becomes a hole 75 formed of a gap. A plurality of holes 75 is formed inside the first solder 6A after the hardening. It is thought that, with the progress of the reaction between Ni and Sn, a material constituting the Ni—Fe phase 74 scatters due to the heating so that the hole 75 is formed. The hole 75 formed inside the Ni—Sn phase 74 has a substantially spherical shape and has a diameter of 5 μm or less when viewed from a cross-section. Even when a crack occurs inside the Ni—Sn phase 74, in a case where the hole 75 having a diameter of 5 μm or less is formed inside the Ni—Sn phase 74, since the Ni—Sn phase 74 is a region sufficiently harder than the Sn phase 71 in terms of hardness, the crack reaches the hole 75 formed of the gap so that the progress of the crack can be inhibited. Meanwhile, when the hole 75 has a diameter of more than 5 μm, the hole 75 itself may affect durability of the bonding metal.

Adjacent holes 75 have a center distance of 10 μm or more when viewed from the cross-section. Note that the center distance is defined as a distance between the centers of the adjacent holes 75. In a case where the center distance between the adjacent holes 75 is less than 10 μm, when the crack occurs, for example, the adjacent holes 75 may interlock with each other so as to cause a fissure.

When no hole 75 is formed inside the Ni—Sn phase 74, the Ni—Fe phase 73 remains inside the Ni—Sn phase 74. The Ni—Fe phase 73 has a substantially spherical shape and a diameter of 5 μm or less when viewed from the cross-section. A center distance between the hole 75 and the Ni—Fe phase 73 is 10 μm or more when viewed from the cross-section.

When the additive amount of Bi increases, as illustrated in FIG. 6, the Ni—Sn phase 74 formed around the Ni—Fe phase 73 becomes smaller and a Ni—Sn phase 74 disperses inside the Sn phase 71. When the additive amount of Bi is small (in FIG. 5), the Bi phase 72 is formed around the Ni—Sn phase 74. In contrast, when the additive amount of Bi increases (in FIG. 6), the Bi phase 72 disperses inside the Sn phase 71. The Bi phase 72 may include a simple body of Bi or, for example, a Bi—Sn alloy. The Bi phase 72 has preferably an equivalent diameter of 3 μm or less. Note that, when viewed from the cross-section, the equivalent diameter is 4×A/C where A represents an area of the Bi phase 72 and C represents a length of the circumference of the Bi phase 72. When the equivalent diameter of the Bi phase 72 is larger than 3 μm, the crack may easily progress due to a hard and brittle property of Bi itself in the Bi phase 72.

As described above, in the first solder 6A (the bonding metal) after the hardening, the Ni—Sn phase 74 disperses and remains in the Sn phase 71 deriving from the first metal 61 and the hole 75 is fanned inside the Ni—Sn phase 74. The Ni—Sn phase 74 obtained by the reaction between Ni and Sn has a melting point of more than 400° C. Therefore, the Ni—Sn 74 is prevented from remelting, for example, upon the reflow for the second solder 6B. For example, the Sn phase 71 having a low melting point is also around the Ni—Sn phase 74. However, since the Ni—Sn phase 74 is formed, for example, the scatter or the movement of the solder due to the melting of the Sn phase 71 is inhibited.

The Ni—Sn phase 74 harder than the Sn phase 71 disperses inside the Sn phase 71. Therefore, occurrence of a solder crack in the first solder 6A can be prevented. Even when the first solder 6A after the hardening receives some kind of shock and a fissure occurs on a part of the first solder 6A, since the Ni—Sn phase 74 disperses inside the Sn phase 71, the fissure can be prevented from becoming large when comparing with a case where the same phase spreads. An effect according to the prevention of the occurrence of the solder crack improves, in particular, as illustrated in FIG. 6, when deviation of dimensions of the Ni—Sn phase 74 becomes small and the Ni—Sn phase 74 disperses inside the Sn phase 71. In the first solder 6A after the hardening, also dispersing the Bi phase 72 harder than the Sn phase 71 in the Sn phase 71 increases different phases dispersing inside the Sn phase 71. Therefore, the effect according to the prevention of the occurrence of the solder crack improves and the electronic circuit module component 1 with high durability can be obtained.

Figure 7:
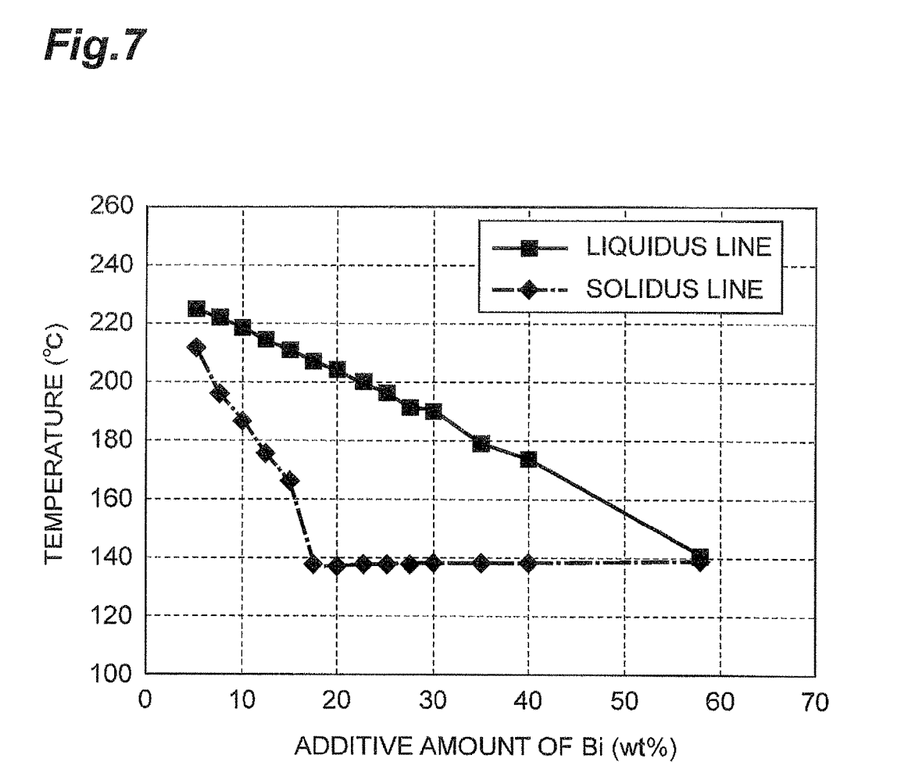
FIG. 7 is a graphical representation of variations of a solidus temperature and a liquidus temperature when an additive amount of Bi is changed with respect to the sum of Sn and Bi.

A liquidus temperature and a solidus temperature of solder including Bi like the first metal 61 vary depending on the additive amount of Bi. FIG. 7 is a graphical representation illustrating a solidus line representing a variation of the solidus temperature and a liquidus line representing a variation of the liquidus temperature when the additive amount of Bi varies with respect to the sum of Sn and Bi. As illustrated in FIG. 7, when the additive amount of Bi is 5 mass % or more, the solidus temperature decreases. Thus, the reaction between Ni and Sn can accelerate at a lower temperature. Therefore, for example, in the mold process where the insulating resin 4 covers the electronic component 2 and the substrate 3 after the first solder 6A hardens, the reaction between Ni and Sn can also accelerate. As a result, there is no need to arrange an additional heating process for accelerating the reaction between Ni and Sn.

Note that, as illustrated in FIG. 7, when the additive amount of Bi exceeds 15 mass %, the solidus temperature decreases to an eutectic temperature (approximately 139° C.). Thus, it can be thought that the first solder after the hardening may remelt in a post-stage process. When the additive amount of Bi exceeds 15 mass %, a segregation amount of Bi may increase in the first solder 6A after the hardening. Hardness of Bi is higher than that of a solder phase mostly including Sn. When the segregation amount of Bi increases in the first solder 6A after the hardening, the crack may easily progress due to the hard and brittle property of Bi itself.

According to the present embodiment, the second metal 62 including the Ni—Fe alloy that easily reacts with Sn is further added to the first metal 61 including Sn and Bi. Accordingly, an reaction between Sn and the Ni—Fe alloy can promptly progress for a short period of time required for the reflow.

In order to increase the melting point of the first solder 6A that has hardened after the melting, it is necessary to accelerate the reaction between Sn and Ni—Fe in a melting state and then accelerate a formation of the Ni—Sn phase 74. Accordingly, as illustrated in FIG. 3, the first metal 61 and the second metal 62 that constitute the first solder 6A before the melting are preferably granular. As described above, since a contact area between the first metal 61 and the second metal 62 increases, the reaction between Sn and Ni—Fe accelerates. Accordingly, the first solder 6A that has hardened after the melting can be prevented from remelting. Note that, as illustrated in FIG. 4, when the first solder 6A before the melting is wiry, at least the second metal 62 is preferably granular. Note that, when the first metal 61 and/or the second metal 62 are granular, particles of the first metal 61 and/or the second metal 62 are substantially spherical. The first metal 61 and the second metal 62 have shapes similar to a spherical shape so that the contact area between the first metal 61 and the second metal 62 further increases.

It has been known that the first solder 6A shows a tendency not to absorb thermal energy as an average particle diameter of the second metal 62 decreases. This tendency remains even when a ratio of the second metal 62 varies. The contact area between the first metal 61 and the second metal 62 increases upon the melting as the average particle diameter of the second metal 62 decreases. Thus, the reaction between Sn and the Ni—Fe alloy easily progresses and the formation of the Ni—Sn phase 74 accelerates. Meanwhile, manufacturing and handling of the particle of the second metal 62 become difficult as the average particle diameter of the second metal 62 decreases.

Therefore, the average particle diameter of the second metal 62 is preferably 3 to 50 μm, more preferably 5 to 30 μm. When the average particle diameter of the second metal 62 is 50 μm, in the tissue of the first solder 6A after the hardening, the formation of the Ni—Sn phase 74 does not sufficiently progress and a rise of the melting point after the first solder 6A melts and hardens decreases. When the average particle diameter of the second metal 62 is less than 3 μm, it can be thought that the manufacturing and the handling of the particle of the second metal 62 become difficult. When the average particle diameter of the second metal 62 is less than 5 μm, since a surface area with respect to the particle diameter is large, the particle of the second metal 62 tend to oxidize. As a result, there is a risk that the particle of the second metal 62 does not melt by reheating upon the reflow and remains as an oxidized particle on the substrate. Arranging the average particle diameter of the second metal 62 of 5 μm or more can prevent the oxidized particle from remaining and is more preferable. Note that, according to the present embodiment, the average particle diameter of the second metal 62 is in the range of 10 to 36 μm.

According to the present embodiment, an additive ratio of the second metal 62 is preferably 5 to 30 mass % with respect to the sum of the first metal 61 and the second metal 62. In this range, after the electronic component 2 is mounted on the substrate 3 of the electronic circuit module component 1 with the first solder 6A, even when the second reflow is performed in a case where the electronic circuit module component 1 is mounted on the device board 8, the occurrence of the solder flash and the movement of the first solder 6A can be inhibited. Even when the electronic component 2 is mounted on the substrate 3 with the first solder 6A, an appropriate self-alignment effect is obtained so that the electronic component 2 can be positioned. As described above, arranging the additive ratio of the second metal 62 in the above range is suitable for mounting the electronic component 2 included in the electronic circuit module component 1.

Powder of the second metal 62 is manufactured by a method for manufacturing metal powder, such as a water atomization method or a gas atomization method. When the water atomization method is used, a surface of the manufactured powder oxidizes.

The first solder 6A is manufactured by adding the second metal 62 with the surface of the powder that has oxidized, to the first metal 61. However, in a melting state, the powder of the second metal 62 gathers on a surface of the first solder 6A that has hardened due to an effect of the oxide film. As a result, almost all the first metal 61 and the second metal 62 separate from each other so that the reaction between the first metal 61 and the second metal 62 does not accelerate. Thus, the rise of the melting point of the first solder 6A is not expected.

Therefore, when the second metal 62 oxidizes in a process for manufacturing the metal powder, for example, the second metal 62 is preferably deoxidized in a hydrogen atmosphere and then added to the first metal 61. Accordingly, the first metal 61 accelerates the reaction between the first metal 61 and the second metal 62 during the first melting. Therefore, the first solder 6A that has hardened after the melting can secure a melting point higher than that before the melting.

The acceleration of the reaction between the first metal 61 and the second metal 62 is evaluated with an amount of oxygen included in the powder of the second metal 62 as a parameter. As a result, when a ratio of the oxygen included in the powder of the second metal 62 is 1.5 mass %, the acceleration of the reaction between the first metal 61 and the second metal 62 is insufficient and the rise of the melting point of the first solder 6A is not expected. Meanwhile, when the ratio of the oxygen included in the powder of the second metal 62 decreases to 0.24 mass %, the reaction of the first metal 61 and the second metal 62 accelerates and the melting point of the first solder 6A increases.

A ratio of Fe accounting for in the second metal 62 is not limited. However, when the ratio of Fe is 8 mass % or more, the rise of the melting point of the first solder 6A that has hardened after the melting is observed. When the ratio of Fe is 5 mass % or more, the melting point of the first solder 6A that has hardened after the melting becomes higher than the second reflow temperature (240 to 260° C.). Meanwhile, when the ratio of Fe exceeds 16 mass %, the formation of the Ni—Sn phase 74 does not sufficiently progress so that the melting temperature of the first solder 6A may decrease. Therefore, the ratio of Fe accounting for in the second metal 62 is preferably 5 to 16 mass %, more preferably, 8 to 16 mass %.

As described above, the electronic circuit module component 1 according to the present embodiment includes the plurality of holes 75 each formed of the gap being a region in which the Ni—Fe phase 73 is, inside the Ni—Sn phase 74 dispersing inside the Sn phase 71 in the bonding metal (the first solder 6A having hardened). In the Ni—Sn phase 74 including the hole 75 having a diameter of 5 μm or less disposed therein, since the Ni—Sn phase 74 is a region higher than the Sn phase 71 in terms of hardness, even when the crack occurs in the Ni—Sn phase 74, the crack reaches the hole 75 formed of the gap so that the progress of the crack can be inhibited. Therefore, the durability for the electronic circuit module component 1 improves. In particular, when, an electronic circuit module component in the related art has a structure in which the bonding metal (the first solder 6A) is sealed by not only the insulating resin 4 but also the shield layer 5, the defect of the solder flash notably occurs. Therefore, it is thought that having the configuration of the electronic circuit module component 1 according to the present embodiment increases an improvement effect of the durability.

The Pb-free solder (the above-described first solder 6A) used for the first solder 6A includes the first metal 61 including at least Sn and Bi, to which the second metal 62 including at least Ni—Fe alloy is added. In the process in which the Pb-free solder first melts, the reaction between Sn in the first metal 61 and the Ni—Fe alloy in the second metal 62 promptly progresses. The Ni—Sn phase is formed after the reaction so that the Pb-free solder having hardened has the melting point higher than that before the Pb-free solder first melts and thermal resistance is improved. As a result, even when the Pb-free solder is reheated by the following reflow after melting once, the Pb-free solder does not melt or the melting is inhibited.

The above Pb-free solder is used for bonding the electronic component 2 included in the electronic circuit module component 1. Therefore, a risk that the solder flash or the movement of the solder occurs in the electronic circuit module component 1 in the reflow when the electronic circuit module component 1 is mounted on, for example, the device board, can be reduced. The electronic circuit module component 1 using the Pb-free solder according to the present embodiment can reduce a risk that, for example, a bonding defect of a terminal of the electronic component 2 occurs. Therefore, a yield can be improved.

The Pb-free solder used for the electronic circuit module component 1 according to the present embodiment has the melting point that increases after the Pb-free solder melts and hardens once. Therefore, the Pb-free solder is effective for, for example, bonding a part that requires thermal resistance. In this case, a temperature at which the Pb-free solder according to the present embodiment first melts is similar to that of a SnBi based (Sn as a base material to which Bi is added) solder (approximately 220° C.). Therefore, workability is prevented from degrading upon the bonding. Furthermore, using the first metal 61 including Sn and Bi can use, as heat treatment that accelerates the formation of Ni—Sn phase, for example, a heat treatment process in a process for manufacturing the electronic circuit module component 1, such as the mold process. Thus, for example, no additional heat treatment process is required. Accordingly, the workability is dramatically improved. Since the Pb-free solder according to the present embodiment includes relatively inexpensive metals of Sn, Bi, Ni, and Fe, an increase of a manufacturing cost of, for example, the electronic circuit module component 1 can be inhibited.

Furthermore, in the electronic circuit module component 1 according to the present embodiment, since the hole 75 is formed inside the Ni—Sn phase 74 in the bonding metal (the first solder 6A that has hardened), even when the crack occurs inside the Ni—Sn phase 74, the crack reaches the hole 75 formed of the gap and the progress of the crack can be inhibited. Therefore, the durability for the electronic circuit module 1 is improved. When the diameter of the hole 75 is 5 μm or less and the center distance between the adjacent holes 75 is 10 μm or more, the improvement effect of the durability becomes notable.

When the bonding metal further includes the Bi phase 72, since the hardness of Bi is higher than those of the other phases and regions each including different hardness are formed in the bonding metal, the progress of the crack is inhibited. When the equivalent diameter of the Bi phase 72 is 3 μm or less, in particular, an effect for inhibiting the progress of the crack is obtained.

Even when the Ni—Fe phase 73 is formed in a region separating from the hole 75 in the bonding metal with the center distance of 10 μm or more, forming the regions each having the different hardness in the bonding metal inhibits the progress of the crack.

The Pb-free solder and the electronic circuit module component 1 according to the embodiment of the present invention have been described. However, the Pb-free solder and the electronic circuit module component 1 according to the present invention are not limited to the above configuration.

In the above embodiment, the description in which the SnBi based solder is used as the Pb-free solder, has been given. As the first solder 6A for the electronic circuit module component 1 including the above bonding metal, other materials can be used. As described above, in order to reduce the risk that the solder flash or the movement of the solder occurs in the electronic circuit module component 1 in the reflow, Bi may be added to the Pb-free solder used for the bonding metal. An additive form of Bi is not limited to the above embodiment. For example, as a method for including Bi in solder composition, it can be thought of a method that uses Sn—Bi solder (a configuration having been described in the above embodiment) or Sn—Ag—Bi solder. Meanwhile, as a method for adding Bi as an additive like the second metal 62, it can be thought of a method for adding Bi as a particle of Ni—Bi composition or Ni-3Bi composition. In any of the above cases, the melting point of the bonding metal in the electronic circuit module component 1 increases and the durability is improved. The configuration of the electronic circuit module component 1 having been described in the above embodiment can be appropriately changed. The bonding metal having been described in the above embodiment, namely, the bonding metal including the Sn alloy phases, the Ni—Sn alloy phase that disperses between the Sn alloy phases and includes at least Fe, and the plurality of holes that has a diameter of 5 μm or less and is formed in the Ni—Sn alloy phase, can be also applied to bonding that includes, for example, bonding through a lead frame and uses high temperature solder in the related art.

(Embodiments)

The present invention will be further specifically described below based on embodiments and comparative examples. However, the present invention is not limited to the following embodiments.

<First Embodiment>

Twenty samples according to a first embodiment (electronic circuit module components) were prepared by the following procedure.

(1) Solder paste was printed on a terminal electrode of a substrate. The solder paste included Pb-free solder in which Ni—Fe alloy particles (Fe was 10 mass % and an average particle diameter of 20 μm) were added to SnBi based solder (Sn was 92.5 mass % and Bi was 7.5 mass %) so as to be 15 mass % with respect to the sum total.

(2) A mounter was used so that a chip-type resistance element, as an electronic component, was mounted on the substrate.

(3) The substrate including the electronic component mounted thereon was put into a reflow furnace and the solder paste was heated in a typical reflow process (a peak temperature of 240° C., melting for one minute). The Pb free-solder included in the solder paste melted and hardened. After that, a terminal electrode of the electronic component and the terminal electrode of the substrate were bonded with the Pb-free solder that had hardened.

(4) Flux adhering to the electronic component and a surface of the substrate were cleaned.

(5) The electronic component and the substrate were covered with an insulating resin. An epoxy resin including a filler added thereto (for example, a silica filler in the present evaluation) was used for the insulating resin for covering the electronic component and the substrate. The electronic component and the substrate were coated with the insulating resin so as to be covered. Then, the insulating resin was subjected to a thermal press so as to harden in a vacuum chamber. Mold post-cure treatment was performed at 175° C. for four hours. As a result, the electronic component was sealed with the insulating resin. Twenty electronic circuit module components according to the first embodiment were prepared by the above procedure.

<Second Embodiment>

In the manufacturing method described in the first embodiment, twenty electronic circuit module components according to a second embodiment were prepared in the same condition as the first embodiment other than an additive amount of the Ni—Fe alloy particles that was set to be 5 mass %.

<Third Embodiment>

In the manufacturing method described in the first embodiment, twenty electronic circuit module components according to a third embodiment were prepared in the same condition as the first embodiment other than a reflow condition with a peak temperature of 240° C. and melting for two minutes.

<Fourth Embodiment>

In the manufacturing method described in the third embodiment, twenty electronic circuit module components according to a fourth embodiment were prepared in the same condition as the third embodiment other than an additive amount of the Ni—Fe alloy particles that was set to be 5 mass %.

<Fifth Embodiment>

In the manufacturing method described in the first embodiment, twenty electronic circuit module components according to a fifth embodiment were prepared in the same condition as the first embodiment other than a particle diameter of the Ni—Fe alloy particle that was set to be 10 μm.

<Sixth Embodiment>

In the manufacturing method described in the fifth embodiment, twenty electronic circuit module components according to a sixth embodiment were prepared in the same condition as the fifth embodiment other than an additive amount of the Ni—Fe alloy particles that was set to be 5 mass %.

<Seventh Embodiment>

In the manufacturing method described in the fifth embodiment, twenty electronic circuit module components according to a seventh embodiment were prepared in the same condition as the fifth embodiment other than a reflow condition with a peak temperature of 240° C. and melting for two minutes.

<Eighth Embodiment>

In the manufacturing method described in the seventh embodiment, twenty electronic circuit module components according to an eighth embodiment were prepared in the same condition as the seventh embodiment other than an additive amount of the Ni—Fe alloy particles that was set to be 5 mass %.

<Ninth Embodiment>

Twenty electronic circuit module components according to a ninth embodiment were prepared in the same condition as the first embodiment other than use of Sn based solder to which Bi metal particles were added, instead of the SnBi based solder.

<Tenth Embodiment>

Twenty electronic circuit module components according to a tenth embodiment were prepared in the same condition as the third embodiment other than use of Sn based solder to which Bi metal particles were added, instead of the SnBi based solder.

<First Comparative Example>

In the manufacturing method described in the first embodiment, twenty electronic circuit module components according to a first comparative example were prepared in the same condition as the first embodiment other than a further additional high heat treatment (200° C. for one hour).

<Second Comparative Example>

In the manufacturing method described in the first embodiment, twenty electronic circuit module components according to a second comparative example were prepared in the same condition as the first embodiment other than an additive amount of the Ni—Fe alloy particles that was set to be 35 mass %.

The electronic circuit module components obtained by the above methods were evaluated regarding an tissue observation, thermal resistance (solder flash inhibition), and thermal shock resistance (crack inhibition) of the bonding metal.

<Evaluation Method: 1. Tissue Observation of Bonding Metal>

A cross-section of the electronic circuit module component was observed by a scanning electron microscope. A size of the hole (a maximal hole diameter), a minimal distance between the holes, a size of the Ni—Fe phase when there is the Ni—Fe phase, and a thickness of the Ni—Sn phase (a distance between the Sn phase and the hole) were measured.

<Evaluation Method: 2. Thermal Resistance (Solder Flash Inhibition)>

The thermal resistance (solder flash inhibition) was evaluated as follows. First, the sample to be evaluated (the electronic circuit module component) was put into the reflow furnace at 260° C. A movement of the solder in a bonding portion between the electronic component and the substrate in the electronic circuit module component was observed. When a condition in which the bonding metal (the solder material) of the bonding portion diffused other than the bonding portion, was observed, the evaluation was denoted with D. When no diffusion was observed and a bonding surface of a bonding portion on the side of the substrate varied, the evaluation was denoted with C. When a shape variation of a bonding portion on the side of an electronic component terminal was observed, the evaluation was denoted with B. When the bonding surface and the shape of the bonding portion did not vary, the evaluation was denoted with A.

<Evaluation Method: 3. Thermal Shock Resistance (Crack Inhibition)>

The thermal shock resistance (crack inhibition) was evaluated as follows. First, the sample to be evaluated (the electronic component and the substrate were not covered with the insulating resin) was put into a thermal shock testing machine that alternately provided environments of −55° C. and 125° C. every 30 minutes, and was left in 500 cycles. After that, the bonding portion formed of the solder after the hardening was observed. A crack of a surface of the bonding portion and progress of the solder crack with a cross-sectional observation were checked and evaluated.

When no crack occurred on the bonding portion, the evaluation was denoted with A. When the occurrence of the crack was observed and a length of the crack was ⅓ or less of a thickness of the solder of the bonding portion, the evaluation was denoted with B. When the length of the crack was ⅓ to ½ of the thickness of the solder of the bonding portion, the evaluation was denoted with C. When the length of the crack is ½ or more of the thickness of the solder of the bonding portion, the evaluation was denoted with D.

<Evaluation Result>

Results of the above evaluations will be shown in Table 1. When at least one of the thermal resistance (the solder flash inhibition) and the thermal shock resistance (the crack inhibition) was evaluated with B, an overall evaluation was B. When at least one of the items was evaluated with C, the overall evaluation was C. When both of the items were evaluated with A, the overall evaluation was A.

TABLE 1

| | Maximal hole diameter (μm) | Minimal distance between holes (μm) | Maximal Ni—Fe particle diameter (μm) | Minimal Ni—Sn alloy thickness (μm) | Bi alloy diameter (μm) | Thermal resistance solder flash inhibition | Thermal shock resistance crack inhibition | Overall evaluation |
|---|---|---|---|---|---|---|---|---|
| First embodiment | 5 | 10 | 20 | 5 | — | A | B | B |
| Second embodiment | 5 | 100 | 20 | 10 | — | B | B | B |
| Third embodiment | 5 | 10 | — | 5 | — | A | B | B |
| Fourth embodiment | 5 | 100 | — | 10 | — | B | B | B |
| Fifth embodiment | 0.5 | 10 | 20 | 5 | — | A | B | B |
| Sixth embodiment | 0.5 | 100 | 20 | 10 | — | B | B | B |
| Seventh embodiment | 0.5 | 10 | — | 5 | — | A | B | B |
| Eighth embodiment | 0.5 | 100 | — | 10 | — | B | B | B |
| Ninth embodiment | 5 | 10 | 20 | 5 | 3 | A | A | A |
| Tenth embodiment | 5 | 10 | — | 5 | 3 | A | A | A |
| First comparative example | 8 | 10 | 20 | 5 | — | A | C | C |
| Second comparative example | 5 | 8 | 20 | 5 | — | A | C | C |

What is claimed is:

1. An electronic circuit module component comprising:
an electronic component;
a circuit board including the electronic component mounted thereon; and
a bonding metal disposed between a terminal electrode of the electronic component and a terminal electrode of the circuit board, and including Sn alloy phases, an Ni—Sn alloy phase that disperses and forms between the Sn alloy phases and includes at least Fe, a Bi alloy phase, and a plurality of holes that is formed inside the Ni—Sn alloy phase and has a diameter of 5 µm or less,
wherein
a center distance between the holes adjacent to each other is 10 µm or more,
the Ni—Sn alloy phase that includes at least Fe is dispersed in one of the Sn alloy phases as a main phase,
the Bi alloy phase is dispersed in the Sn alloy main phase,
an Ni—Fe phase is on the inside of the Ni—Sn phase, and
the holes replace at least some of the Ni—Fe phase that was on the inside of the Ni—Sn phase.

2. The electronic circuit module component according to claim 1, wherein the Bi alloy phase has an equivalent diameter is 3 µm or less.

3. The electronic circuit module component according to claim 1, wherein an Ni—Fe alloy phase is included in a region separating from the hole with a center distance of 10 µm or more.

4. The electronic circuit module component according to claim 1, wherein the hole formed inside the Ni—Sn phase has a substantially spherical shape and has a diameter of 5 µm or less when viewed from a cross-section.

5. The electronic circuit module component according to claim 1, wherein when some of the Ni—Fe phase remains on the inside of the Ni—Sn phase, the Ni—Fe phase has a substantially spherical shape and a diameter of 5 µm or less when viewed from a cross-section.

6. The electronic circuit module component according to claim 5, wherein when some of the Ni—Fe phase remains on the inside of the Ni—Sn phase, and holes form in the remainder of the Ni—Fe phase, a center distance between a hole and the Ni—Fe phase is 10 µm or more when viewed from a cross-section.

7. The electronic circuit module component according to claim 1, wherein the Bi alloy phase has an equivalent diameter of 3 µm or less.

* * * * *

UNITED STATES PATENT AND TRADEMARK OFFICE
CERTIFICATE OF CORRECTION

PATENT NO. : 10,253,395 B2
APPLICATION NO. : 14/923831
DATED : April 9, 2019
INVENTOR(S) : Tsutomu Yasui et al.

It is certified that error appears in the above-identified patent and that said Letters Patent is hereby corrected as shown below:

On the Title Page

Please add, Item (30) Foreign Application Priority Data as follows:
-- October 29, 2014     (JP).......................2014-220091 --.

Signed and Sealed this
Ninth Day of July, 2019

Andrei Iancu
*Director of the United States Patent and Trademark Office*